United States Patent
Chen et al.

(10) Patent No.: US 11,289,407 B2
(45) Date of Patent: Mar. 29, 2022

(54) PACKAGE STRUCTURE

(71) Applicant: Vanguard International Semiconductor Corporation, Hsinchu (TW)

(72) Inventors: Chih-Yen Chen, Tainan (TW); Chun-Yi Wu, Taichung (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 38 days.

(21) Appl. No.: 16/909,234

(22) Filed: Jun. 23, 2020

(65) Prior Publication Data

US 2021/0398883 A1 Dec. 23, 2021

(51) Int. Cl.
*H01L 23/495* (2006.01)
*H01L 23/00* (2006.01)

(52) U.S. Cl.
CPC .. *H01L 23/49513* (2013.01); *H01L 23/49562* (2013.01); *H01L 24/32* (2013.01); *H01L 24/73* (2013.01); *H01L 2224/32257* (2013.01); *H01L 2224/73265* (2013.01); *H01L 2924/1033* (2013.01); *H01L 2924/10344* (2013.01); *H01L 2924/13064* (2013.01)

(58) Field of Classification Search
CPC ................................................ H01L 23/49513
See application file for complete search history.

(56) References Cited

U.S. PATENT DOCUMENTS

| | | | |
|---|---|---|---|
| 2003/0034557 A1 | 2/2003 | Gupta et al. | |
| 2012/0211892 A1* | 8/2012 | Kim | H01L 21/561 257/774 |
| 2014/0061669 A1* | 3/2014 | Otremba | H01L 24/29 257/77 |
| 2015/0262960 A1* | 9/2015 | Standing | H01L 23/4824 257/76 |
| 2016/0071877 A1* | 3/2016 | Kim | H01L 27/11526 257/314 |

FOREIGN PATENT DOCUMENTS

| | | |
|---|---|---|
| TW | 201834221 A | 9/2018 |
| TW | 201947791 A | 12/2019 |

OTHER PUBLICATIONS

Taiwanese Office Action and Search Report for Taiwanese Application No. 109111139, dated Aug. 24, 2020.

* cited by examiner

*Primary Examiner* — Walter H Swanson
(74) *Attorney, Agent, or Firm* — Birch, Stewart, Kolasch & Birch, LLP

(57) ABSTRACT

A package structure is provided. The package structure includes a die, a lead frame, and a conductive glue. The lead frame includes a die pad and a retaining wall structure. The die pad is configured to support the die, and the retaining wall structure surrounds the die. The conductive glue is disposed between the die and the lead frame.

18 Claims, 5 Drawing Sheets

PACKAGE STRUCTURE

BACKGROUND

Technical Field

The present disclosure relates to a package structure, and specifically to a package structure including a die pad having a retaining wall structure.

Description of the Related Art

Gallium nitride-based (GaN-based) semiconductor materials have many excellent characteristics, such as high thermal resistance, a wide band-gap, and a high electron saturation rate. Therefore, GaN-based semiconductor materials are suitable for use in high-speed and high-temperature operating environments. In recent years, GaN-based semiconductor materials have been widely used in light-emitting diode (LED) devices and high-frequency devices, such as high electron mobility transistors (HEMT) with heterogeneous interfacial structures.

Even though current package structures of high electron mobility transistors may be adequate for their intended purposes, they have not been entirely satisfactory in every aspect. For example, in the current die mounting technique of packaging high electron mobility transistor (HEMT) devices, glue overflow become easily unstable and thus adversely affect the operation of the device. Therefore, the industry still aims at improving performance and the reliability of the package structure of the high electron mobility transistor devices goals.

SUMMARY

Embodiments of the present disclosure provide a packaging structure, including a die, a lead frame, and a conductive glue. The lead frame includes a die pad and a retaining wall structure. The die pad is configured to support the die and the retaining wall structure surrounds the die. The conductive glue is disposed between the die and the lead frame.

The embodiments of the present disclosure also provide a packaging structure, including a die and a lead frame. The lead frame includes a die pad having a retaining wall structure. The retaining wall structure defines a confined region. The die is adhered to the die pad by a conductive glue. The conductive glue is confined in the confined region.

A detailed description is given in the following embodiments with reference to the accompanying drawings.

BRIEF DESCRIPTION OF THE DRAWINGS

Aspects of the present disclosure are best understood from the following detailed description when read with the accompanying figures. It is noted that, various features are not drawn to scale, and are only used for illustrative purpose. In fact, the dimensions of the various features may be arbitrarily increased or reduced for clarity of discussion.

DETAILED DESCRIPTION

Figure 1:
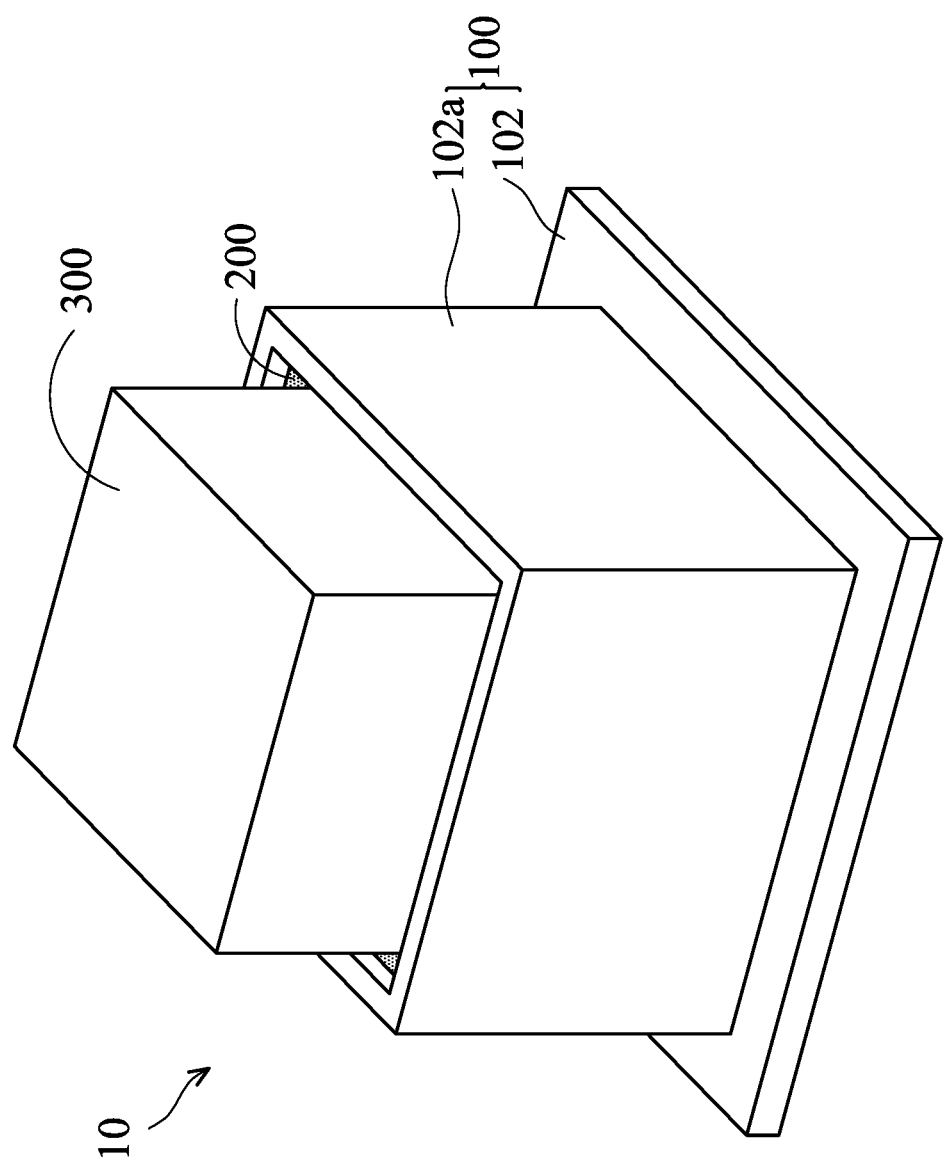
FIG. 1 illustrates a perspective view of an exemplary package structure according to some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms used herein (including technical and scientific terms) have same meanings as comprehended by those skilled in the art. It should be understood that these terms, such as generally defined by commonly used dictionaries, should be interpreted in consistent with related technology and background information of the present disclosure, and should not be interpreted in idealized or overly formal ways, unless they have specific definitions in the embodiments of the present disclosure.

The following disclosed embodiments may repeat reference numerals and/or letters in various embodiments. This repetition is for the purpose of simplicity and clarity, and does not in itself dictate a relationship between the various embodiments discussed.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

The package structure provided by embodiments of the present disclosure includes a die pad having a retaining wall structure, and thereby stabilizing as well as glue overflow preventing electromagnetic interference (EMI). In addition, the package structure provided by embodiments of the present disclosure further includes a conductive glue, which contacts the seed layer and the lead frame, so that the seed layer may be electrically grounded, thereby improving the operational stability of the semiconductor structure. In addition, the die provided by embodiments of the present disclosure may increase the breakdown voltage of the semiconductor structure without a through-GaN-via and allow the semiconductor device to be used for high voltage operation.

Figure 2:
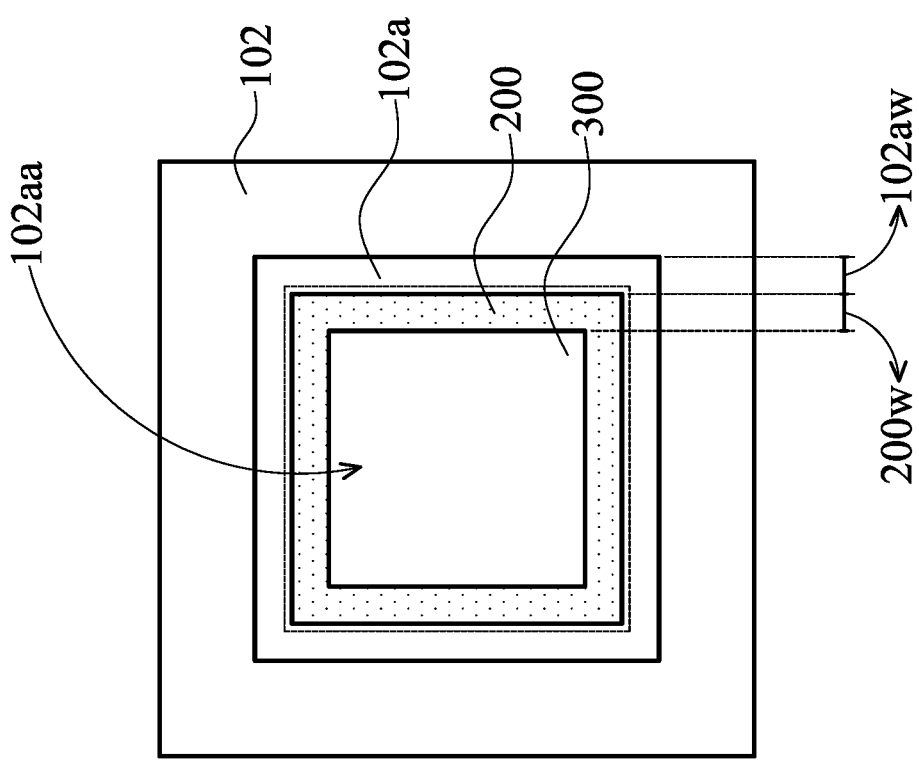
FIG. 2 illustrates a top view of the package structure corresponding to FIG. 1 according to some embodiments of the present disclosure.

Referring to FIG. 1 and FIG. 2, FIG. 1 illustrates a perspective view of an exemplary packaging structure 10 according to some embodiments of the present disclosure. FIG. 2 illustrates a top view of the package structure corresponding to FIG. 1 according to some embodiments of the present disclosure.

First referring to FIG. 1, the package structure 10 includes a lead frame 100, a conductive glue 200 and a die 300. The conductive glue 200 is disposed between the lead frame 100 and the die 300. The lead frame 100 includes a die pad 102 and a retaining wall structure 102a. The die pad 102 is configured to support the die 300 and the retaining wall structure 102a surrounds the die 300.

In some embodiments, the material of the lead frame 100 may include metals, such as copper (Cu), iron-nickel (NiFe), lead (Pb), tin (Sn), gold (Au), nickel (Ni), platinum (Pt), palladium (Pd), iridium (Ir), titanium (Ti), chromium (Cr), tungsten (W), aluminum (Al), stainless, other suitable materials, or a combination thereof.

In some embodiments, the retaining wall structure 102a and the die pad 102 may be formed by stamping or etching the lead frame. That is, the retaining wall structure 102a may be integrally formed on the die pad 102. In such a case, the retaining wall structure 102a and the die pad 102 are formed of the same material. In other embodiments, the retaining wall structure 102a may be adhered to the die pad 102. In such case, the retaining wall structure 102a and the die pad 102 may be formed of different materials.

In some embodiments, the die pad 102 is perpendicular to the retaining wall structure 102a on the upper surface of the die pad 102. Using this configuration, a spacing between the die 300 and the retaining wall structure 102a remains uniform, so that the height of the conductive glue 200 is controlled stably.

In some embodiments, the material of the conductive glue 200 may include a polymer matrix and conductive particles dispersed in the polymer matrix. In some embodiments, the polymer matrix may include an acrylic resin such as polymethylmetacrylate (PMMA), epoxy resin, silicone, maleic anhydride, other suitable matrix materials, or a combination thereof. In some embodiments, the material of the conductive particle may include silver (Ag), copper (Cu), gold (Au), aluminum (Al), nickel (Ni), carbon (C), other suitable conductive materials, or a combination thereof. In some embodiments, the conductive glue 200 may be formed by a coating process, a printing process, or other suitable processes. In some embodiments, a dispenser may be used to coat the conductive glue 200 on the die pad 102 inside the retaining wall structure 102a to control the amount of the glue.

In some embodiments, the die 300 may include transistors used to switch on and off and switch electronic signals, and so on. For example, high electron mobility transistors (HEMT) may be used, and will be described below.

In some embodiments, the lead frame 100 having the retaining wall structure 102a is fabricated first, and then the die pad 102 inside the retaining wall structure 102a is coated by the conductive glue 200, and finally the die 300 is mounted on the die pad 102 inside the retaining wall structure 102a. In this case, the conductive glue 200 extends upward along the gap between the retaining wall structure 102a and the die 300. Compared to controlling the amount of the glue only by the dispenser, the retaining wall structure 102a provided by the present disclosure may not only control the extent of glue overflow, but also control the conductive glue 200 to rise along the retaining wall structure 102a to the predetermined position of the die 300.

In some embodiments, the conductive glue 200 is positioned between the die 300 and the die pad 102 and between the die 300 and the retaining wall structure 102a.

In some embodiments, the height of the conductive glue 200 is not higher than the height of the retaining wall structure 102a. In other words, the retaining wall structure 102a is not lower than the conductive glue 200 between the die 300 and the retaining wall structure 102a, thereby preventing the conductive glue 200 from overflowing to other portions of the lead frame, and improving reliability of the package.

In some embodiments, the retaining wall structure 102a exposes an upper portion of the die 300. In other words, the top surface of the retaining wall structure 102a is lower than the top surface of the die 300 in order to prevent the retaining wall structure 102a from affecting subsequent wiring.

Next, referring to FIG. 2, in some embodiments, the lead frame 100 includes the die pad 102 having the retaining wall structure 102a, and the retaining wall structure 102a defines a confined region 102aa. The die 300 is adhered to the die pad 102 by the conductive glue 200, and the conductive glue 200 is confined in the confined region.

In FIG. 2, it can be seen that the conductive glue 200 surrounding the die 300 is a frame shape, and the retaining wall structure 102a surrounding the conductive glue 200 is also a frame shape. In other words, from the center of the die 300 outward, the conductive glue 200 and the retaining wall structure 102a are disposed in order. In FIG. 1, the retaining wall structure 102a may also be viewed as a rectangular frame structure surrounding the die 300.

In addition, it should be appreciated that in FIG. 2, the confined region 102aa defined by the retaining wall structure 102a is completely occupied by the conductive glue 200 and the die 300. In FIG. 2, an area of the die is about 80%-95% of an area of the confined region. When it is larger than 95%, the conductive glue may tend to extend over the retaining wall structure 102a and thus overflow to the other portion of the lead frame 100. Therefore, the reliability of the package will be reduced and positioning will also be difficult while mounting the die. When it is less than 80%, not only is it difficult to raise the conductive glue 200 to the predetermined position, but also the retaining wall structure 102a may be far from the die 300, and thus the ability to prevent electromagnetic interference (EMI) may be reduced.

In the embodiment of FIG. 2, the width 102aw of the retaining wall structure 102a is about 30-40 μm. When the width is greater than about 40 μm, the conductive wire may easily form a connection with the lead frame, thereby causing a short-circuit during subsequent wiring. When the width is less than about 30 μm, the ability to prevent electromagnetic interference (EMI) is reduced and thus the reliability of the package is easily impacted.

In the embodiment of FIG. 2, a spacing 200w between the retaining wall structure 102a and the die 300 (or the width of the conductive glue 200) is about 10-20 μm. When the spacing 200w is greater than about 20 μm, not only can a short-circuit easily form between the conductive wire and the lead frame during subsequent wire bonding, but it also may be difficult to raise the conductive glue 200 to the predetermined position. When the spacing 200w is less than about 10 μm, the conductive glue 200 can easily spill over the retaining wall structure 102a once an excess amount of the conductive glue is dispensed, and thus overflow to other portions of the lead frame 100, thereby reducing the reliability of the package.

The package structure provided by the present disclosure may utilize the retaining wall structure to stabilize the glue overflow and prevent electromagnetic interference (EMI), thereby improving the performance of the package.

Figure 3:
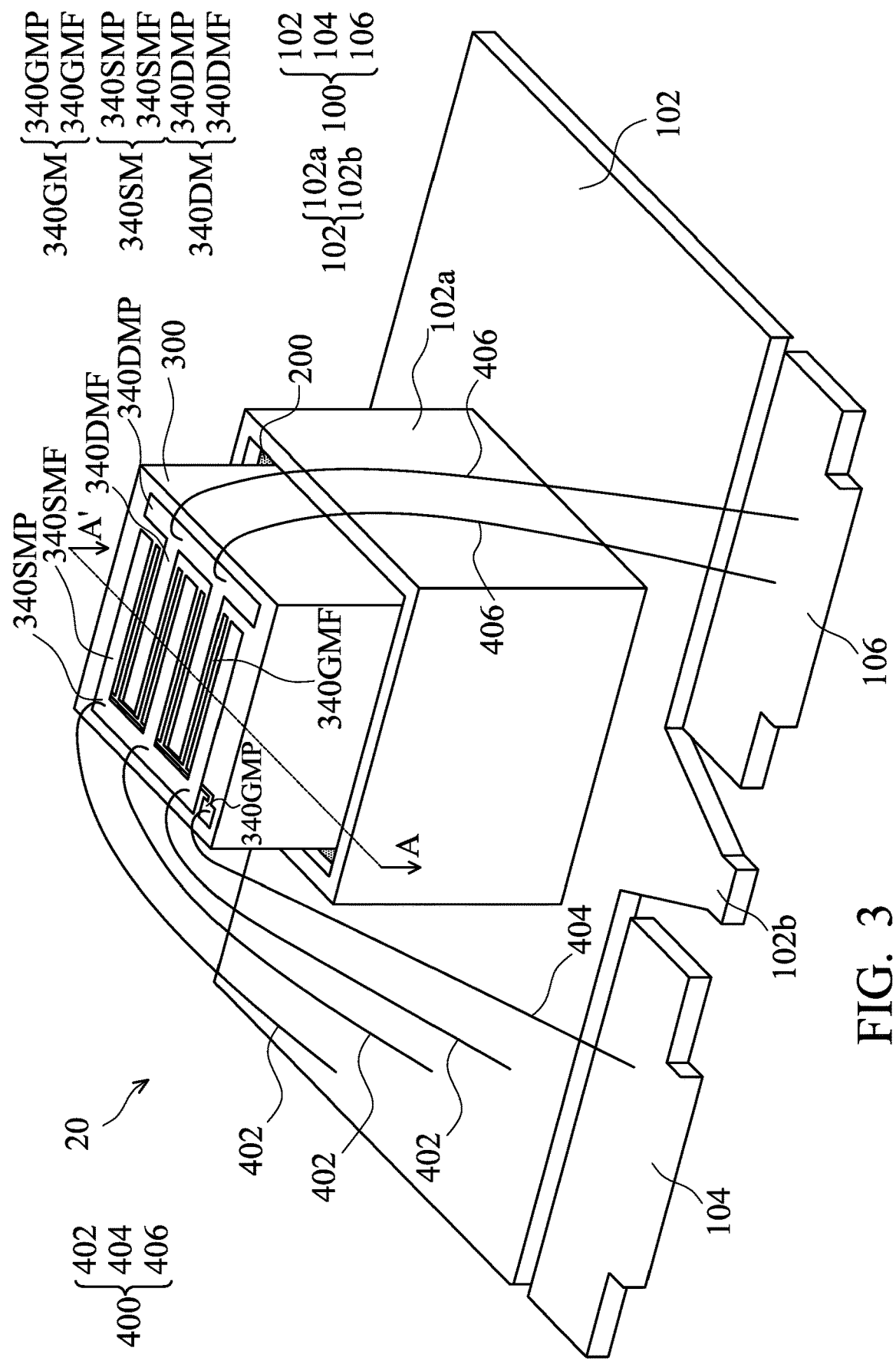
FIG. 3 illustrates a perspective view of an exemplary package structure according to other embodiments of the present disclosure.
Figure 4:
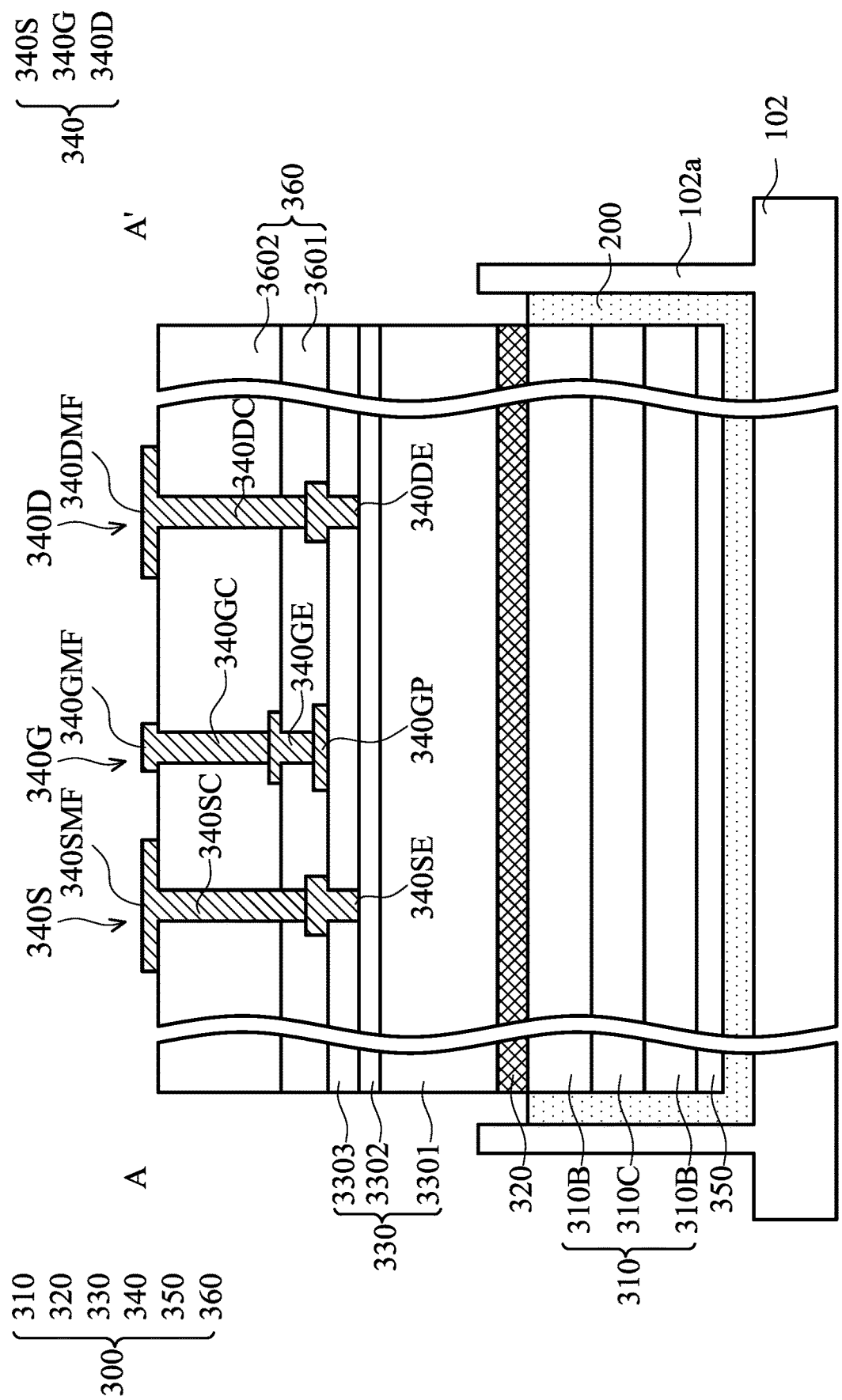
FIG. 4 illustrates a cross-sectional view of the package structure corresponding to FIG. 3 according to other embodiments of the present disclosure.

Next, referring to FIGS. 3 and 4, FIG. 3 illustrates a perspective view of an exemplary package structure 20 according to other embodiments of the present disclosure. FIG. 4 illustrates a cross-sectional view of the package structure corresponding to FIG. 3 according to other embodiments of the present disclosure.

In FIG. 3, the lead frame 100, the die 300 and the wiring therebetween are more specifically depicted comparing to the package structure 10 of FIG. 1.

Specifically, in FIG. 3, the lead frame 100 may further include a first lead 102*b*, a second lead 104 and a third lead 106, which are not connected to each other. The first lead 102*b*, retaining wall structure 102*a*, and the die pad 102 are formed integrally and have the same material. In an embodiment, the die pad 102 includes the retaining wall structure 102*a* and the first lead 102*b*. The die pad 102 may be electrical grounded and serve as a source lead. In an embodiment, the second lead 104 and the third lead 106 serve as a gate lead and a drain lead, respectively, for subsequent electrical connection.

It should be noted that in order to more clearly depict the relationship between the lead frame and the die, a transistor out-line (TO) is used herein as an example. However, different types of packages may be applied in the present disclosure, such as a dual flat no lead (DFN), a quad flat no lead (QFN), a power quad flat no lead (PQFN), and so on, but the disclosure is not limited thereto. In addition, it should also be noted that in order to succinctly describe the embodiments of the present disclosure and highlight the technical features thereof, not all the elements of the package structure are completely illustrated in FIG. 3.

In addition, in FIG. 3, the top portion of the die 300 include a source metal layer 340SM, a gate metal layer 340GM, and a drain metal layer 340DM, which have a pad portion and a finger portion, respectively. Specifically, the source metal layer 340SM has a source metal layer pad portion 340SMP and a source metal layer finger portion 340SMF. The gate metal layer 340GM has a gate metal layer pad portion 340GMP and a gate metal layer finger portion 340GMF. The drain metal layer 340DM has a drain metal layer pad portion 340DMP and a drain metal layer finger portion 340DMF.

In some embodiments, the source metal layer 340SM, the drain metal layer 340GM, the drain metal layer 340DM are the multi-finger structures. Using this configuration, the integration density of the transistor structure 340 may be increased (or the size of the transistor structure 340 may be reduced), thereby improving the performance of the semiconductor device in the die. In some embodiments, the source metal layer 340SM and the drain metal layer 340DM are interdigitated, thereby increasing the amount of on-current in the transistor structure 340 and reducing the on-resistance.

It should be noted that the number of fingers in the metal layer finger pad illustrated in FIG. 3 is shown as an example but not intended to limiting. Thus, the number of fingers may be increased or reduced depending on the practical circumstances and requirements.

In some embodiments, the source metal layer finger portion 340SMF, the gate metal layer finger portion 340GMF, and the drain metal layer finger portion 340DMF may be referred to as a metal layer finger portion, which may serve as an active region. In some embodiments, the active region is a region where carriers (such as electrical charge) flow.

In some embodiments, the source metal layer pad portion 340SMP, the gate metal layer pad portion 340GMP, the drain metal layer pad portion 340DMP may be referred to as a metal layer pad, and may electrically connect the lead frame 100 via a conductive wire 402/404/406 (or referred to as a conductive wire 400). Specifically, a conductive wire 402 is electrically connected to the source metal layer pad portion 340SMP and the electrically grounded die pad 102. A conductive wire 404 is electrically connected the gate metal layer pad portion 340GMP and the second lead 104 serving as the gate lead. A conductive wire 406 is electrically connected to the drain metal layer pad portion 340DMP and the third lead 106 serving as the drain lead. Compared to the conductive wire having a line shape, the conductive wire 400 has an upward bending curve. That is, the conductive wire 400 has a certain degree of curvature that an undesirable connection to portions other than the top portion of the die (such as the lead frame) may be prevented to avoid short circuit. In addition, compared to the case where the conductive wire 402 is electrically connected to the first lead 102*b*, electrically connecting the conductive wire 402 to the die pad 102 may prevent the conductive wire 402 from contacting adjacent conductive wires, so that line crossing and the resulting short circuit may be avoided.

In addition, the package structure 20 may further include an encapsulation material (not shown), which may include materials such as epoxy resin. The encapsulation material may cover and protect the lead frame 100, the conductive glue 200, and the die 300 and may expose a portion of the first lead 102*b*, the second lead 104 and the third lead 106 in order to electrically connect other elements.

Next, FIG. 4 is a cross-sectional view obtained along the cross-section line A-A' in FIG. 3. From A to A' in the cross-sectional line of FIG. 3, there are the retaining wall structure 102*a*, the conductive glue 200, the source metal layer finger portion 340SMF, the gate metal layer finger portion 340GMF, the drain metal layer finger portion 340DMF, the gate metal layer finger portion 340GMF and so on. However, in order to illustrate the arrangement of the films in the die, the retaining wall structure 102*a* and the conductive glue 200 at both sides and the source metal layer finger portion 340SMF, the gate metal layer finger portion 340GMF, and the drain metal layer finger portion 340DMF in the middle are selectively shown in FIG. 4.

Referring to FIG. 4, the die 300 includes a substrate 310, a seed layer 320 on the substrate 310, an epitaxial layer 330 on the seed layer 320, a transistor structure 340 on the epitaxial layer 330. The details of the respective film are described below.

In some embodiments, the substrate 310 includes a ceramic base substrate 310C and a pair of blocking layers 310B sandwiching the ceramic base substrate 310C.

In some embodiments, the ceramic base substrate 310C includes a ceramic material. The ceramic material includes a metal inorganic material. In some embodiments, the ceramic base substrate 310C may include silicon carbide (SiC), aluminum nitride (AlN), sapphire, or another suitable material. The aforementioned sapphire base may include aluminum oxide.

In some embodiments, the blocking layers 310B on the upper and lower surface of the ceramic base substrate 310C may include one or more layers of insulating material and/or another suitable material (such as a semiconductor layer). The insulating material layer may include an oxide, a nitride, an oxynitride, or another suitable material. The semiconductor layer may include polycrystalline silicon. The blocking layers 310B may prevent the ceramic base substrate 310C from diffusion and may block the ceramic base substrate 310C from interaction with other layers or process tools.

In some embodiments, the seed layer 320 is formed on the blocking layer 310B. In some embodiments, the seed layer 320 is made of silicon (Si), aluminum nitride (AlN) or another suitable material. In some embodiments, the methods for forming the seed layer 320 include a selective epitaxial growth (SEG) process, a chemical vapor deposition (CVD) process, a molecular beam epitaxy (MBE) process, deposition of doped amorphous semiconductor (e.g., Si) followed by a solid-phase epitaxial recrystallization (SPER) step, methods of directly attaching seed crystals, or another suitable process. The CVD process may include a vapor-phase epitaxy (VPE) process, a low pressure CVD (LPCVD) process, an ultra-high vacuum CVD (UHV-CVD) process, or another suitable process.

In some embodiments, the top surface of the conductive glue 200 is higher than or equal to the bottom surface of the seed layer 320 (or the top surface of the conductive glue 200 is level with the bottom surface of the seed layer 320 at least). In this way, the conductive glue 200 may electrically connect the lead frame 100 and the seed layer 320. Therefore, the accumulated charges in the seed layer 320 may be easily guided to the lead frame 100, thereby reducing the capacitance and improving the stability of the package structure. In addition, by this configuration, the lateral leakage current in the seed layer 320 may be reduced and the heat dissipation effect of the package structure may be improved.

In some embodiments, the retaining wall structure 102a is higher than the top surface of the seed layer 320, so that the conductive glue 200 may reach to the predetermined position (such as the bottom surface of the seed layer 320) without overflowing to the other portion of the lead frame.

In some embodiments, the epitaxial layer 330 on the seed layer 320 includes a buffer layer 3301 on the seed layer 320, a channel layer 3302 on the buffer layer 3301, and a barrier layer 3303 on the channel layer 3302.

In some embodiments, the buffer layer 3301 is formed on the seed layer 320 using an epitaxial growth process. Formation of the buffer layer 3301 may be helpful to mitigate the strain on the channel layer 3302 that is subsequently formed on the buffer layer 3301, and to prevent defects in the overlying channel layer 3302. In some embodiments, the buffer layer 3301 includes AlN, GaN, $Al_xGa_{1-x}N$ (wherein 0<x<1), a combination thereof, or the like. The buffer layer 3301 may be formed using a process such as hydride vapor phase epitaxy (HVPE), molecular beam epitaxy (MBE), metal organic chemical vapor deposition (MOCVD), a combination thereof, other suitable methods or the like. Although the buffer layer 3301 in the embodiment as shown in FIG. 4 is a single layer, the buffer layer 3301 may be a multilayered structure in other embodiments.

Next, a channel layer 3302 is formed on the buffer layer 3301 by an epitaxial growth process. In some embodiments, the channel layer 3302 includes an undoped III-V group compound semiconductor material. For example, the channel layer 3302 is made of undoped GaN, but the present disclosure is not limited thereto. In some other embodiments, the channel layer 3302 includes AlGaN, AlN, GaAs, GaInP, AlGaAs, InP, InAlAs, InGaAs, other suitable III-V group compound materials, or a combination thereof. In some embodiments, the channel layer 3302 is formed using a molecular-beam epitaxy method (MBE), a hydride vapor phase epitaxy method (HVPE), a metalorganic chemical vapor deposition method (MOCVD), other suitable methods, or a combination thereof.

Next, a barrier layer 3303 is formed on the channel layer 3302 by an epitaxial growth process. In some embodiments, the barrier layer 3303 includes an undoped III-V group compound semiconductor material. For example, the barrier layer 3303 includes undoped $Al_xGa_{1-x}N$ (wherein 0<x<1), but the present disclosure is not limited thereto. In some other embodiments, the barrier layer 3303 includes GaN, AlN, GaAs, GaInP, AlGaAs, InP, InAlAs, InGaAs, other suitable III-V group compound materials, or a combination thereof. The barrier layer 3303 may be formed using a molecular-beam epitaxy method (MBE), a metalorganic chemical vapor deposition method (MOCVD), a hydride vapor phase epitaxy method (HVPE), other suitable methods, or a combination thereof.

In some embodiments, the channel layer 3302 and the barrier layer 3303 include different materials from each other such that a heterojunction is formed between the channel layer 3302 and the barrier layer 3303. Therefore, a two-dimensional electron gas (2DEG) which is generated by a band gap between the hetero-materials may be formed at the interface between the channel layer 3302 and the barrier layer 3303. In some embodiments, the semiconductor structures, such as high electron mobility transistors (HEMT), may utilize 2DEG as conductive carriers. In some embodiments, the channel layer 3302 may be a GaN layer, and the barrier layer 3303 formed on the channel layer 3302 may be an AlGaN layer, wherein the GaN layer and the AlGaN layer may be doped, such as with an n-type or a p-type dopant, or may have no dopant therein.

Also, in some embodiments, the epitaxial layer 330 is a GaN-containing composite layer. However, the present disclosure is not limited thereto. Besides the buffer layer 3301, the channel layer 3302 and the barrier layer 3303, the epitaxial layer 330 may further include other films and/or layers. In some other embodiments, a carbon-doped layer is further formed between the buffer layer 3301 and the channel layer 3302 to increase the breakdown voltage of the semiconductor structure.

Next, a dielectric layer 360 (such as a first dielectric layer 3601 and a second dielectric layer 3602) is formed on the epitaxial layer 330 and a transistor structure 340 is formed in the dielectric layer 360. In some embodiments, the transistor structure 340 is a high electron mobility transistor (HEMT).

In some embodiments, the transistor structure 340 includes a gate structure 340G, a source structure 340S and a drain structure 340D formed on opposite sides of the gate structure 340G, respectively.

In some embodiments, the gate structure 340G includes a gate electrode 340GE, a gate contact 340GC and a gate metal layer finger portion 340GMF, wherein the gate electrode 340GE is formed on the barrier layer 3303 and the gate metal layer finger portion 340GMF is formed on and electrically connected to the first gate electrode 340GE by the gate contact 340GC. In other embodiments, an optional doped compound semiconductor layer 340GP may be formed between the gate electrode 340GE and the barrier layer 3303. The details will be further described later.

In some embodiments, the source structure 340S includes a source electrode 340SE, a source contact 340GC, and a source metal layer finger portion 340SMF which are electrically connected to each other. The drain structure 340D includes a drain electrode 340DE, a drain contact 340DC, and a drain metal layer finger portion 340DMF which are electrically connected to each other. In some embodiments, the source electrode 340SE and the drain electrode 340DE on opposite sides of the gate electrode 340GE penetrate through the barrier layer 3303 and contact the channel layer 3302.

In some embodiments, the material of the gate electrode 340GE may be conductive materials, such as metal, metal nitride, or semiconductor materials. In some embodiments, the metal materials may be Au, Ni, Pt, Pd, Ir, Ti, Cr, W, Al, Cu, the like, a combination thereof, or multilayers thereof. The semiconductor materials may be polycrystalline silicon or polycrystalline germanium. The conductive material may be formed on the barrier layer 3303 by chemical vapor deposition (CVD), sputtering, resistive thermal evaporation process, electron beam evaporation process, or other suitable deposition processes, and a patterning process is performed on the conductive material to form the gate electrode 340GE.

In some embodiments, before the formation of the gate electrode 340GE, the doped compound semiconductor layer 340GP may be formed on the barrier layer 3303, and the gate electrode 340GE is formed on the doped compound semiconductor layer 340GP subsequently. The generation of 2DEG under the gate electrode 340GE can be inhibited by the doped compound semiconductor layer 340GP between the gate electrode 340GE and the barrier layer 3303 so as to attain a normally-off status of the semiconductor structure. In some embodiments, the material of the doped compound semiconductor layer 340GP may be GaN which is doped with a p-type dopant or an n-type dopant. The steps of forming the doped compound semiconductor layer 340GP may include depositing a doped compound semiconductor layer (not shown) on the barrier layer 3303 by using an epitaxial growth process, and performing a patterning process on the doped compound semiconductor layer to form the doped compound semiconductor layer 340GP corresponding to the predetermined position where the gate electrode 340GE is to be formed.

The material and the formation of the source electrode 340SE and the drain electrode 340DE which are formed on opposite sides of the first gate electrode 340GE may be substantially the same as the material and the formation of the gate electrode 340GE. The details are not described again herein to avoid repetition. In some embodiments, as shown in FIG. 4, the source electrode 340SE and the drain electrode 340DE both penetrate through the barrier layer 3303 and contact the channel layer 3302.

In some embodiments, the gate metal layer finger portion 340GMF, the gate contact 340GC, the source contact 340SC, the source metal layer finger portion 340SMF, the drain contact 340DC, and the drain metal layer finger portion 340DMF may be formed by a deposition process and a patterning process. The material of the gate metal layer finger portion 340GMF, the gate contact 340GC, the source contact 340SC, the source metal layer finger portion 340SMF, the drain contact 340DC, and the drain metal layer finger portion 340DMF may include conductive materials, such as aluminium (Al), copper (Cu), tungsten (W), titanium (Ti), tantalum (Ta), titanium nitride (TiN), tantalum nitride (TaN), nickel silicide (NiSi), cobalt silicide (CoSi), tantalum carbide (TaC), tantalum silicide nitride (TaSiN), tantalum carbide nitride (TaCN), titanium aluminide (TiAl), titanium aluminide nitride (TiAlN), metal oxides, metal alloys, other suitable conductive materials, or a combination thereof.

In some embodiments, the gate electrode 340GE is formed in the first dielectric layer 3601 on the first dielectric layer 3601, and the gate metal layer finger portion 340GMF is formed on the second dielectric layer 3602 which is formed on the first dielectric layer 3601. Furthermore, the source contact 340SC and the drain contact 340DC on opposite sides of the gate structure 340G both penetrate through the second dielectric layer 3602 on the first second dielectric layer 3601 and contact the source electrode 340SE and the drain electrode 340DE, respectively. The source metal layer finger portion 340SMF and the drain metal layer finger portion 340DMF are formed on the second dielectric layer 3602 and are electrically connected to the source contact 340SC and the drain contact 340DC, respectively.

In some embodiments, the first dielectric layer 3601, and the second dielectric layer 3602 may include a single layer or multi-layers of dielectric materials, such as silicon oxide, silicon nitride, silicon oxynitride, tetraethoxysilane (TEOS), phosphosilicate glass (PSG), borophosphosilicate glass (BPSG), low-k dielectric materials, and/or other suitable dielectric materials. The low-k dielectric materials may include fluorinated silica glass (FSG), hydrogen silsesquioxane (HSQ), carbon-doped silicon oxide, amorphous fluorinated carbon, parylene, bis-benzocyclobutenes (BCB), or polyimide, but not limited thereto.

In some embodiments, a deposition process, such as spin coating, chemical vapor deposition (CVD), physical vapor deposition (PVD), atomic layer deposition (ALD), high density plasma CVD (HDPCVD), other suitable methods, or a combination thereof, may be used to deposit the dielectric materials on the epitaxial layer 330 (e.g. the barrier layer 3303) to form the first dielectric layer 3601, and the second dielectric layer 3602.

In addition, although a single metal layer in FIG. 4 is illustrated to show the top metal layer of the die in FIG. 3, multiple metal layers and dielectric layers may also be formed under the top metal layer, and the present disclosure is not limited thereto. Thus, the number of the metal layers and the dielectric layers may be adjusted to meet practical requirements. In addition, for the sake of brevity, the gate metal layer finger portion 340GMF and the source metal layer finger portion 340SMF are illustrated in the same plane. However, they may be at the different planes and may be adjusted to meet practical requirements.

Next, still referring to FIG. 4, the die 300 further includes a back metal layer 350 between the substrate 310 and the conductive glue 200. Specifically, the back metal 350 is positioned between the blocking layer 310B and the conductive glue 200.

In some embodiments, the materials of back metal layer 350 include silver Ag, Cu, TiNiAg, the alloys thereof, or the suitable materials or the like. In some embodiments, the formation of the back metal layer 350 includes plating and sputtering and the like.

By disposing the back metal layer 350 under the substrate 310 before mounting the die 300, the die 300 may easily dissipate heat after packaging. Also, the back metal layer may be used to ground electronic signals.

Figure 5:
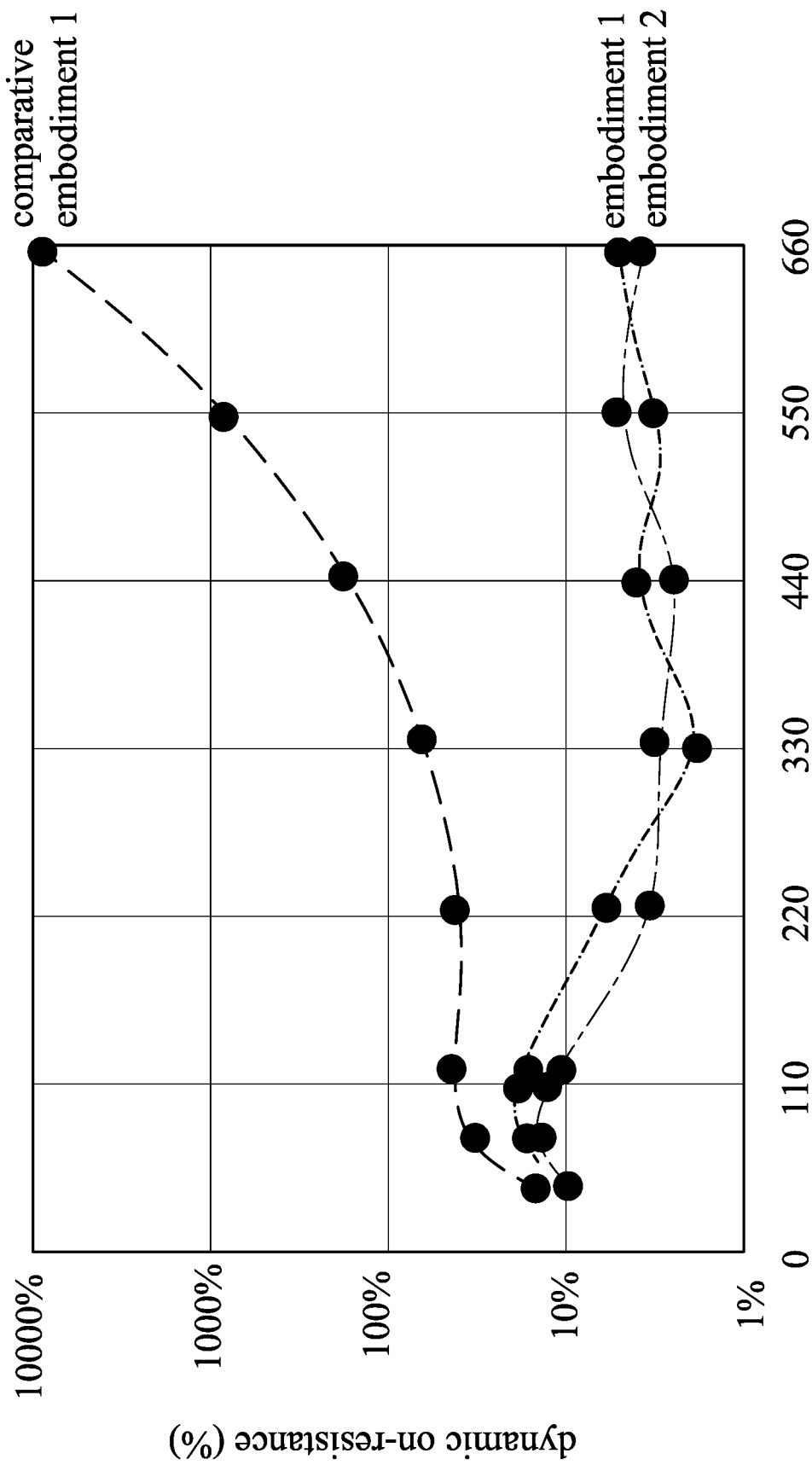
FIG. 5 illustrates a graph showing the relationship between dynamic-on resistance and drain to source voltage according to another embodiment of the present disclosure.

Next, referring to FIG. 5, FIG. 5 illustrates a graph showing the relationship between dynamic on-resistance and drain to source voltage according to another embodiment of the present disclosure.

FIG. 5 is a graph showing dynamic-on resistance of various glues when using the die pad 102 having the retaining wall structure. Embodiments 1 and 2 use the conductive glue (such as a silver glue) while comparative embodiments 1 uses the non-conductive glue (such as an epoxy glue). It can be observed that as voltage increases, dynamic on-resistance of embodiments 1 and 2 does not dramatically increase, and thus may be regarded as a stable state. In contrast, as voltage increases, dynamic on-resistance of comparative embodiment 1 dramatically increases, and thus may be regarded as an unstable state.

As voltage increases, leakage current in the buffer layer may increase, and thus dynamic on-resistance may also increase. When using conductive glue (such as embodiments 1 and 2), electrical charge in the seed layer may be guided to the lead frame along the conductive glue at off-state, and thus electrical charge is not accumulated too much in the seed layer and the substrate current may be inhibited at on-state. Therefore, dynamic on-resistance may reduce dramatically.

By the retaining wall structure provided by the present disclosure, the conductive glue may reach the predetermined position and thus dynamic on-resistance may be reduced dramatically during high voltage and may be viewed as a stable state. In addition, the retaining wall structure provided by the present disclosure may further prevent electromagnetism from interfering with the signals of elements in the die. Also, the backside of the substrate may be used for electrically grounding in the present disclosure, thereby increasing the breakdown voltage of the semiconductor structure and reducing the risk of lateral leakage current.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
    a die comprising:
       a substrate;
       a seed layer on the substrate;
       an epitaxial layer on the seed layer; and
       a transistor structure on the epitaxial layer;
    a lead frame comprising a die pad and a retaining wall structure, wherein the die pad is configured to support the die and the retaining wall structure surrounds the die; and
    a conductive glue disposed between the die and the lead frame,
    wherein a top surface of the retaining wall structure is lower than a top surface of the die and higher than a top surface of the seed layer.

2. The package structure of claim 1, wherein the conductive glue is positioned between the die and the die pad and is positioned between the die and the retaining wall structure.

3. The package structure of claim 2, wherein the retaining wall structure is not lower than the conductive glue between the die and the retaining wall structure.

4. The package structure of claim 1, wherein the retaining wall structure exposes an upper portion of the die.

5. The package structure of claim 1, wherein the retaining wall structure is integrally formed on the die pad.

6. The package structure of claim 1, wherein a top surface of the conductive glue is higher than or equal to a bottom surface of the seed layer.

7. The package structure of claim 1, wherein the conductive glue electrically connects the lead frame and the seed layer.

8. The package structure of claim 1, wherein the lead frame and the transistor structure are electrically connected by a conductive wire.

9. The package structure of claim 1, wherein a metal layer of a top portion of the transistor structure comprises a pad portion and a finger portion, wherein the finger portion acts as an active region and the pad portion and the lead frame are electrically connected by a conductive wire.

10. The package structure of claim 1, wherein the die further comprises a back metal layer disposed between the substrate and the conductive glue.

11. The package structure of claim 1, wherein the substrate comprises a pair of blocking layers and a ceramic base substrate sandwiched between the blocking layers.

12. The package structure of claim 1, wherein in a top view, a spacing between the retaining wall structure and the die is 10-20 μm.

13. The package structure of claim 1, wherein in a top view, a width of the retaining wall structure is 30-40 μm.

14. A package structure, comprising:
    a lead frame comprising a die pad having a retaining wall structure, wherein the retaining wall structure defines a confined region; and
    a die adhered to the die pad by a conductive glue, wherein the conductive glue is confined in the confined region and the die comprises:
       a substrate;
       a seed layer on the substrate;
       an epitaxial layer on the seed layer; and
       a transistor structure on the epitaxial layer,
    wherein a top surface of the retaining wall structure is lower than a top surface of the die and higher than a top surface of the seed layer.

15. The package structure of claim 14, wherein a height of the conductive glue is not higher than a height of the retaining wall structure.

16. The package structure of claim 14, wherein the retaining wall structure is a rectangular frame structure surrounding the die.

17. The package structure of claim 14, wherein the retaining wall structure is perpendicular to an upper surface of the die pad.

18. The package structure of claim 14, wherein an area of the die is 80%-95% of an area of the confined region.

* * * * *